US011217710B2

(12) United States Patent
Hon et al.

(10) Patent No.: US 11,217,710 B2
(45) Date of Patent: Jan. 4, 2022

(54) METHOD AND SYSTEM FOR GERMANIUM-ON-SILICON PHOTODETECTORS WITHOUT GERMANIUM LAYER CONTACTS

(71) Applicant: Luxtera LLC, Wilmington, DE (US)

(72) Inventors: Kam-Yan Hon, Oceanside, CA (US); Gianlorenzo Masini, Carlsbad, CA (US); Subal Sahni, La Jolla, CA (US)

(73) Assignee: Luxtera LLC, Wilmington, DE (US)

( * ) Notice: Subject to any disclaimer, the term of this patent is extended or adjusted under 35 U.S.C. 154(b) by 43 days.

(21) Appl. No.: 16/774,070

(22) Filed: Jan. 28, 2020

(65) Prior Publication Data

US 2020/0161482 A1  May 21, 2020

Related U.S. Application Data

(63) Continuation of application No. 14/926,916, filed on Oct. 29, 2015, now Pat. No. 10,546,963.

(Continued)

(51) Int. Cl.
*H01L 31/0224* (2006.01)
*H01L 31/109* (2006.01)
(Continued)

(52) U.S. Cl.
CPC ........ *H01L 31/022408* (2013.01); *H01L 31/022416* (2013.01); *H01L 31/103* (2013.01);
(Continued)

(58) Field of Classification Search
CPC ..... H01L 31/022408; H01L 31/022416; H01L 31/103; H01L 31/105; H01L 31/109; G02B 6/4292
See application file for complete search history.

(56) References Cited

U.S. PATENT DOCUMENTS 6,075,253 A   6/2000 Sugiyama
7,397,101 B1  7/2008 Masini et al.
(Continued)

FOREIGN PATENT DOCUMENTS

CN   105762220 A   7/2016
EP     3029728 A1   6/2016
(Continued)

OTHER PUBLICATIONS

European Search Report corresponding to European Patent Application No. 15 19 6803, dated May 4, 2016.
(Continued)

*Primary Examiner* — Que Tan Le
*Assistant Examiner* — Don J Williams
(74) *Attorney, Agent, or Firm* — Patterson + Sheridan, LLP

(57) ABSTRACT

Methods and systems for germanium-on-silicon photodetectors without germanium layer contacts are disclosed and may include, in a semiconductor die having a photodetector, where the photodetector includes an n-type silicon layer, a germanium layer, a p-type silicon layer, and a metal contact on each of the n-type silicon layer and the p-type silicon layer: receiving an optical signal, absorbing the optical signal in the germanium layer, generating an electrical signal from the absorbed optical signal, and communicating the electrical signal out of the photodetector via the n-type silicon layer and the p-type silicon layer. The photodetector may include a horizontal or vertical junction double heterostructure where the germanium layer is above the n-type and p-type silicon layers. An intrinsically-doped silicon layer may be below the germanium layer between the n-type silicon layer and the p-type silicon layer. A top portion of the germanium layer may be p-doped.

20 Claims, 13 Drawing Sheets

Related U.S. Application Data

(60) Provisional application No. 62/086,137, filed on Dec. 1, 2014.

(51) Int. Cl.
  *H01L 31/105* (2006.01)
  *H01L 31/103* (2006.01)
  *G02B 6/42* (2006.01)

(52) U.S. Cl.
  CPC .......... *H01L 31/105* (2013.01); *H01L 31/109* (2013.01); *G02B 6/4292* (2013.01)

(56) References Cited

U.S. PATENT DOCUMENTS

| | | |
|---|---|---|
| 9,490,385 B2 | 11/2016 | Huang |
| 9,978,890 B1 | 5/2018 | Bayn et al. |
| 10,546,963 B2 | 1/2020 | Hon et al. |
| 2002/0027238 A1 | 3/2002 | Lin et al. |
| 2010/0012974 A1 | 1/2010 | Mekia et al. |
| 2011/0305416 A1 | 12/2011 | Shih et al. |
| 2014/0159183 A1 | 6/2014 | Na |

FOREIGN PATENT DOCUMENTS

| | | |
|---|---|---|
| JP | 2009176834 A | 8/2009 |
| JP | 2016111363 A | 6/2016 |
| KR | 20160065768 A | 6/2016 |
| TW | 201630369 A | 8/2016 |
| TW | 201931795 A | 8/2019 |
| WO | 2013180690 A1 | 12/2013 |

OTHER PUBLICATIONS

Sahni et al., "The Dual-Heterojunction Ge on Si Photodetector", ECS Transactions, vol. 64, No. 6, Aug. 12, 2014, pp. 783-789.
Chinese Official Action for Application CN 2018082201752900, dated Aug. 27, 2018.
Official Action for Chinese Application 201510864620.4, dated May 22, 2019.
Notification of Reason for Refusal for Application No. 2015233455 dated Jun. 30, 2020.
Taiwan Office Action for Application: 108114490, dated May 14, 2020.
Korean Intellectual Property Office, Notice of Preliminary Rejection (Non-Final), Application : 10-2015-0170070, dated May 6, 2021.

METHOD AND SYSTEM FOR GERMANIUM-ON-SILICON PHOTODETECTORS WITHOUT GERMANIUM LAYER CONTACTS

CROSS-REFERENCE TO RELATED APPLICATIONS/INCORPORATION BY REFERENCE

This application is a continuation of U.S. patent application Ser. No. 14/926,916 filed on Oct. 29, 2015, now U.S. Pat. No. 10,546,963, which claims priority to and the benefit of U.S. Provisional Application 62/086,137 filed on Dec. 1, 2014, each of which is hereby incorporated herein by reference in its entirety.

FIELD

Certain embodiments of the disclosure relate to semiconductor photonics. More specifically, certain embodiments of the disclosure relate to a method and system for germanium-on-silicon photodetectors without germanium layer contacts.

BACKGROUND

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method for germanium-on-silicon photodetectors without germanium layer contacts, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Certain aspects of the disclosure may be found in a method and system for germanium-on-silicon photodetectors without germanium layer contacts. Exemplary aspects of the disclosure may comprise, in a semiconductor die having a photodetector comprising an n-type silicon layer, a germanium layer, a p-type silicon layer, and a metal contact on each of the n-type silicon layer and the p-type silicon layer: receiving an optical signal, absorbing the optical signal in the germanium layer, generating an electrical signal from the absorbed optical signal, and communicating the electrical signal out of the photodetector via the n-type silicon layer and the p-type silicon layer. The photodetector may comprise a horizontal junction double heterostructure where the germanium layer is above the n-type silicon layer and the p-type silicon layer. An intrinsically-doped silicon layer may be below the germanium layer between the n-type silicon layer and the p-type silicon layer. A portion of the germanium layer nearest the p-doped silicon layer may be p-doped. The photodetector may comprise a vertical junction double heterostructure where the germanium layer is above a lower-doped n-type silicon layer. The n-type silicon layer and the p-type silicon layers may be on opposite sides of the lower-doped silicon layer below the germanium layer where the p-type silicon layer and the lower-doped n-type silicon layer are in contact with the germanium layer while the n-type silicon layer is not. A top portion of the germanium layer may be doped p-type. The photodetector may comprise a surface-illuminated double heterostructure photodetector. The n-type silicon layer and the p-type silicon layer in the surface-illuminated double heterostructure photodetector may comprise interdigitated fingers. The semiconductor die may be a silicon complementary-metal oxide semiconductor (CMOS) die.

Figure 1A:
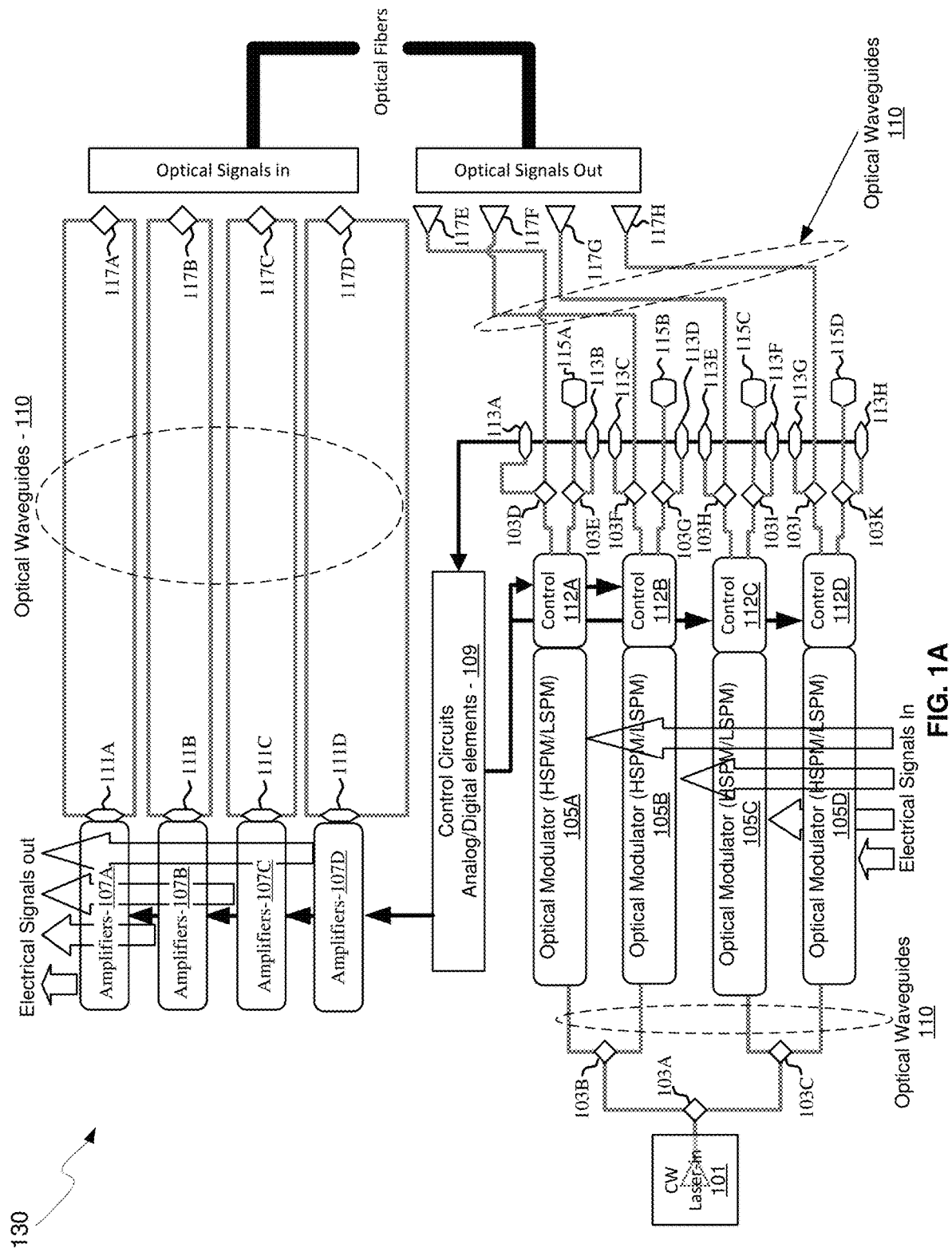
FIG. 1A is a block diagram of a photonically-enabled integrated circuit with germanium detectors without germanium layer contacts, in accordance with an example embodiment of the disclosure.

FIG. 1A is a block diagram of a photonically-enabled integrated circuit with germanium detectors without germanium layer contacts, in accordance with an example embodiment of the disclosure. Referring to FIG. 1A, there are shown optoelectronic devices on a photonically-enabled integrated circuit 130 comprising optical modulators 105A-105D, photodiodes 111A-111D, monitor photodiodes 113A-113H, and optical devices comprising couplers 103A-103K, optical terminations 115A-115D, and grating couplers 117A-117H. There are also shown electrical devices and circuits comprising amplifiers 107A-107D, analog and digital control circuits 109, and control sections 112A-112D. The amplifiers 107A-107D may comprise transimpedance and limiting amplifiers (TIA/LAs), for example.

In an example scenario, the photonically-enabled integrated circuit 130 comprises a CMOS photonics die with a laser assembly 101 coupled to the top surface of the IC 130. The laser assembly 101 may comprise one or more semiconductor lasers with isolators, lenses, and/or rotators within for directing one or more CW optical signals to the coupler 103A. The photonically enabled integrated circuit 130 may comprise a single chip, or may be integrated on a plurality of die, such as with one or more electronics die and one or more photonics die.

Optical signals are communicated between optical and optoelectronic devices via optical waveguides 110 fabricated in the photonically-enabled integrated circuit 130. Single-mode or multi-mode waveguides may be used in photonic integrated circuits. Single-mode operation enables direct connection to optical signal processing and networking elements. The term "single-mode" may be used for waveguides that support a single mode for each of the two polarizations, transverse-electric (TE) and transverse-magnetic (TM), or for waveguides that are truly single mode and only support one mode whose polarization is TE, which comprises an electric field parallel to the substrate supporting the waveguides. Two typical waveguide cross-sections that are utilized comprise strip waveguides and rib waveguides. Strip waveguides typically comprise a rectangular cross-section, whereas rib waveguides comprise a rib section on top of a waveguide slab. Of course, other waveguide cross section types are also contemplated and within the scope of the disclosure.

The optical modulators 105A-105D comprise Mach-Zehnder or ring modulators, for example, and enable the modulation of the continuous-wave (CW) laser input signal. The optical modulators 105A-105D may comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

The outputs of the optical modulators 105A-105D may be optically coupled via the waveguides 110 to the grating couplers 117E-117H. The couplers 103D-103K may comprise four-port optical couplers, for example, and may be utilized to sample or split the optical signals generated by the optical modulators 105A-105D, with the sampled signals being measured by the monitor photodiodes 113A-113H. The unused branches of the directional couplers 103D-103K may be terminated by optical terminations 115A-115D to avoid back reflections of unwanted signals.

The grating couplers 117A-117H comprise optical gratings that enable coupling of light into and out of the photonically-enabled integrated circuit 130. The grating couplers 117A-117D may be utilized to couple light received from optical fibers into the photonically-enabled integrated circuit 130, and the grating couplers 117E-117H may be utilized to couple light from the photonically-enabled integrated circuit 130 into optical fibers. The grating couplers 117A-117H may comprise single polarization grating couplers (SPGC) and/or polarization splitting grating couplers (PSGC). In instances where a PSGC is utilized, two input, or output, waveguides may be utilized.

The optical fibers may be epoxied, for example, to the CMOS chip, and may be aligned at an angle from normal to the surface of the photonically-enabled integrated circuit 130 to optimize coupling efficiency. In an example embodiment, the optical fibers may comprise single-mode fiber (SMF) and/or polarization-maintaining fiber (PMF).

Figure 1B:
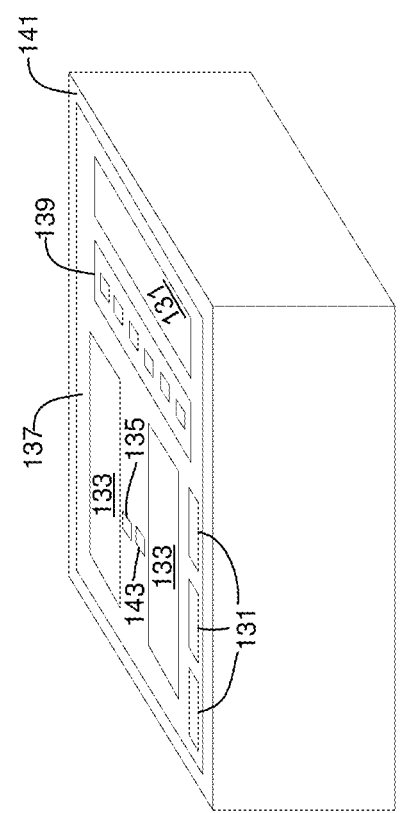
FIG. 1B is a diagram illustrating an exemplary photonically-enabled integrated circuit, in accordance with an example embodiment of the disclosure.

In another exemplary embodiment illustrated in FIG. 1B, optical signals may be communicated directly into the surface of the photonically-enabled integrated circuit 130 without optical fibers by directing a light source on an optical coupling device in the chip, such as the light source interface 135 and/or the optical fiber interface 139. This may be accomplished with directed laser sources and/or optical sources on another chip flip-chip bonded to the photonically-enabled integrated circuit 130.

The photodiodes 111A-111D may convert optical signals received from the grating couplers 117A-117D into electrical signals that are communicated to the amplifiers 107A-107D for processing. In another embodiment of the disclosure, the photodiodes 111A-111D may comprise high-speed heterojunction phototransistors, for example, and may comprise germanium (Ge) in the collector and base regions for absorption in the 1.3-1.6 µm optical wavelength range, and may be integrated on a CMOS silicon-on-insulator (SOI) wafer.

In conventional integrated electronic devices, metal plugs are used to establish a contact to the device electrodes. For example, tungsten plugs are commonly used to establish contact to the drain, source, and gate terminals of MOS transistors, or to the anode and cathode of diodes and photodiodes. This type of contact provides a compact, reliable and low-contact-resistance way of supplying the voltage and carrying the currents in and out of the devices. However, especially where germanium-on-Si integrated photo-detectors are concerned, the following issues arise when contacts are formed on a germanium active region: 1) the presence of contacts on the germanium implies that metal plugs are placed close to the optical mode in the active region of the photo-detector, where absorption occurs, thereby causing scattering loss, thus impairing responsivity; 2) efficient electrical contacts to germanium require high doping in the contact region, but in a photodetector, the low electric field in the highly doped regions results in poor photo-carrier collection from those areas, thereby degrading the quantum efficiency of the device; and 3) the process for contact formation requires the exposure of the Ge film to aggressive cleaning solutions. Germanium is corroded by water since its oxide is water soluble, so these cleaning solutions may cause significant damage to the device.

An alternative approach to the use of metal plugs directly contacting the Ge film, which is compatible with existing process technology and provides a complete solution to the issues mentioned above, is described in this disclosure. In an example scenario, the silicon abutting/surrounding the germanium films assumes an active electrical role by providing the means through which voltage and currents are applied and flow as well as the chemical potential difference causing the rise of the junction built-in voltage. This may be accomplished by realizing a double heterostructure (DH) device in which the current flowing into the germanium device is injected/extracted through highly doped p- and n-type Si/Ge heterojunctions, where the doping is solely in the silicon layers.

The analog and digital control circuits 109 may control gain levels or other parameters in the operation of the amplifiers 107A-107D, which may then communicate electrical signals off the photonically-enabled integrated circuit 130. The control sections 112A-112D comprise electronic circuitry that enable modulation of the CW laser signal received from the splitters 103A-103C. The optical modulators 105A-105D may require high-speed electrical signals to modulate the refractive index in respective branches of a Mach-Zehnder interferometer (MZI), for example. In an example embodiment, the control sections 112A-112D may include sink and/or source driver electronics that may enable a bidirectional link utilizing a single laser.

In operation, the photonically-enabled integrated circuit 130 may be operable to transmit and/or receive and process optical signals. Optical signals may be received from optical fibers by the grating couplers 117A-117D and converted to electrical signals by the photodetectors 111A-111D. The electrical signals may be amplified by transimpedance amplifiers in the amplifiers 107A-107D, for example, and subsequently communicated to other electronic circuitry, not shown, in the photonically-enabled integrated circuit 130.

Integrated photonics platforms allow the full functionality of an optical transceiver to be integrated on a single chip. An optical transceiver chip contains optoelectronic circuits that create and process the optical/electrical signals on the transmitter (Tx) and the receiver (Rx) sides, as well as optical interfaces that couple the optical signals to and from a fiber. The signal processing functionality may include modulating the optical carrier, detecting the optical signal, splitting or combining data streams, and multiplexing or demultiplexing data on carriers with different wavelengths.

FIG. 1B is a diagram illustrating an exemplary photonically-enabled integrated circuit, in accordance with an example embodiment of the disclosure. Referring to FIG. 1B, there is shown the photonically-enabled integrated circuit 130 comprising electronic devices/circuits 131, optical and optoelectronic devices 133, a light source interface 135, a chip front surface 137, an optical fiber interface 139, CMOS guard ring 141, and a surface-illuminated monitor photodiode 143.

The light source interface 135 and the optical fiber interface 139 comprise grating couplers, for example, that enable coupling of light signals via the CMOS chip surface 137, as opposed to the edges of the chip as with conventional edge-emitting/receiving devices. Coupling light signals via the chip surface 137 enables the use of the CMOS guard ring 141 which protects the chip mechanically and prevents the entry of contaminants via the chip edge.

The electronic devices/circuits 131 comprise circuitry such as the amplifiers 107A-107D and the analog and digital control circuits 109 described with respect to FIG. 1A, for example. The optical and optoelectronic devices 133 comprise devices such as the couplers 103A-103K, optical terminations 115A-115D, grating couplers 117A-117H, optical modulators 105A-105D, high-speed heterojunction photodiodes 111A-111D, and monitor photodiodes 113A-113I.

In an example scenario, the high-speed heterojunction photodiodes 111A-111D comprise double heterostructure (DH) devices in which the current flowing into the germanium device is injected/extracted through highly doped p- and n-type Si/Ge heterojunctions, where the doping is solely in the silicon layers.

Figure 1C:
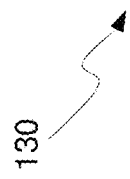
FIG. 1C is a diagram illustrating a photonically-enabled integrated circuit coupled to an optical fiber cable, in accordance with an example embodiment of the disclosure.
Figure 1C:
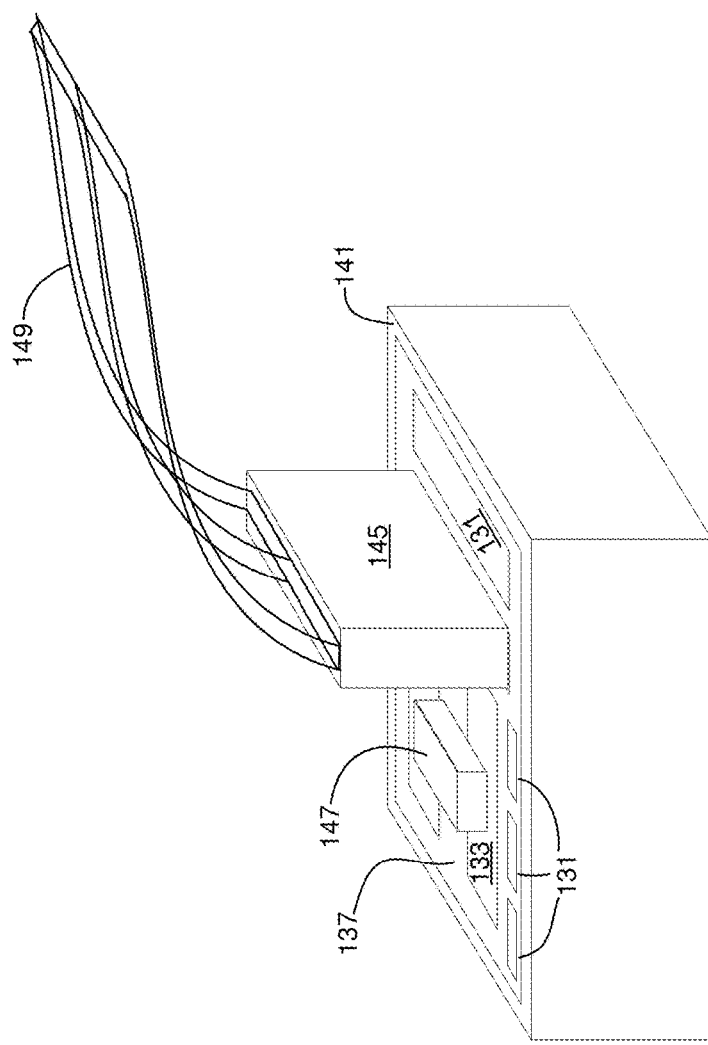

FIG. 1C is a diagram illustrating a photonically-enabled integrated circuit coupled to an optical fiber cable, in accordance with an example embodiment of the disclosure. Referring to FIG. 1C, there is shown the photonically-enabled integrated circuit 130 comprising the chip surface 137, and the CMOS guard ring 141. There is also shown a fiber-to-chip coupler 145, an optical fiber cable 149, and an optical source assembly 147.

The photonically-enabled integrated circuit 130 comprises the electronic devices/circuits 131, the optical and optoelectronic devices 133, the light source interface 135, the chip surface 137, and the CMOS guard ring 141 may be as described with respect to FIG. 1B, for example.

In an example embodiment, the optical fiber cable may be affixed, via epoxy for example, to the CMOS chip surface 137. The fiber chip coupler 145 enables the physical coupling of the optical fiber cable 149 to the photonically-enabled integrated circuit 130.

Figure 2:
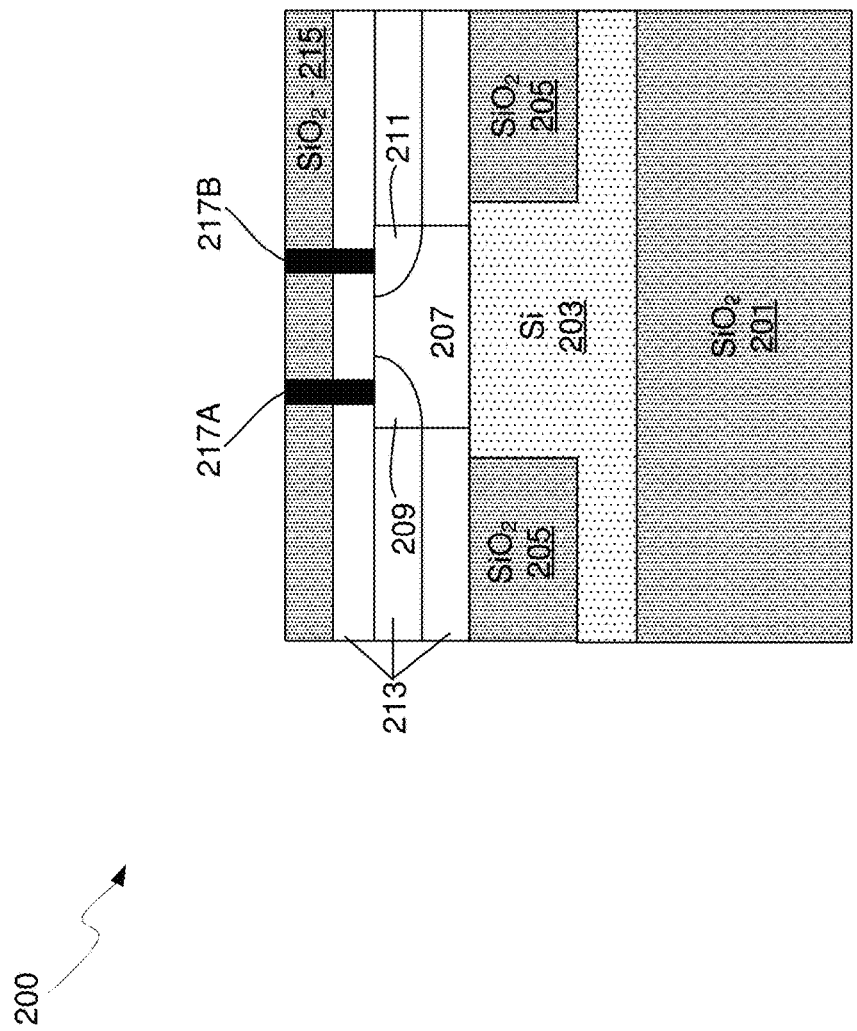
FIG. 2 illustrates a germanium photodetector with contacts on germanium layers, in accordance with an example embodiment of the disclosure.

FIG. 2 illustrates a germanium photodetector with contacts on germanium layers, in accordance with an example embodiment of the disclosure. Referring to FIG. 2, there is shown a photodetector 200 comprising a silicon dioxide ($SiO_2$) layer 201, a silicon layer 203, $SiO_2$ layer 205, a germanium layer 207, n-doped germanium layer 209, p-doped germanium layer 211, waveguide layers 213, a passivating $SiO_2$ layer 215, and plugs 217A and 217B.

In an example scenario, the photodetector 200 may be formed on a silicon-on-insulator (SOI) wafer, where a silicon layer, e.g., the silicon layer 203, is on an oxide layer, the $SiO_2$ layer 203. In addition, trenches formed in the silicon layer 203 may be filled with the $SiO_2$ layers 205 for electrical and/or optical isolation.

A typical Ge-based integrated photodiode is based on p-n or p-i-n junctions formed in the device body. The photodetector 200 comprises a p-i-n structure formed by the p-doped germanium layer 211, the germanium layer 207, and the n-doped germanium layer 209.

Metal contacts, with nearly ohmic transfer functions are normally made in the highly doped p- and n-regions to apply the required bias and to inject and extract the resulting currents. Accordingly, the plugs 217A and 217B comprise metal contacts formed on the n-doped germanium layer 209 and the p-doped layer 211, which are both highly doped to provide good electrical contact but also then causes scattering loss for the optical mode.

The device built-in potential, which plays a key role in determining the rectifying and photocurrent collection functionalities, is normally established by the presence of the doped regions. In these standard devices, the presence of a Si layer has limited impact on the electrical characteristics of the device, and acts as the substrate used to grow the Ge film and to establish the optical connectivity of the device.

Figure 3A:
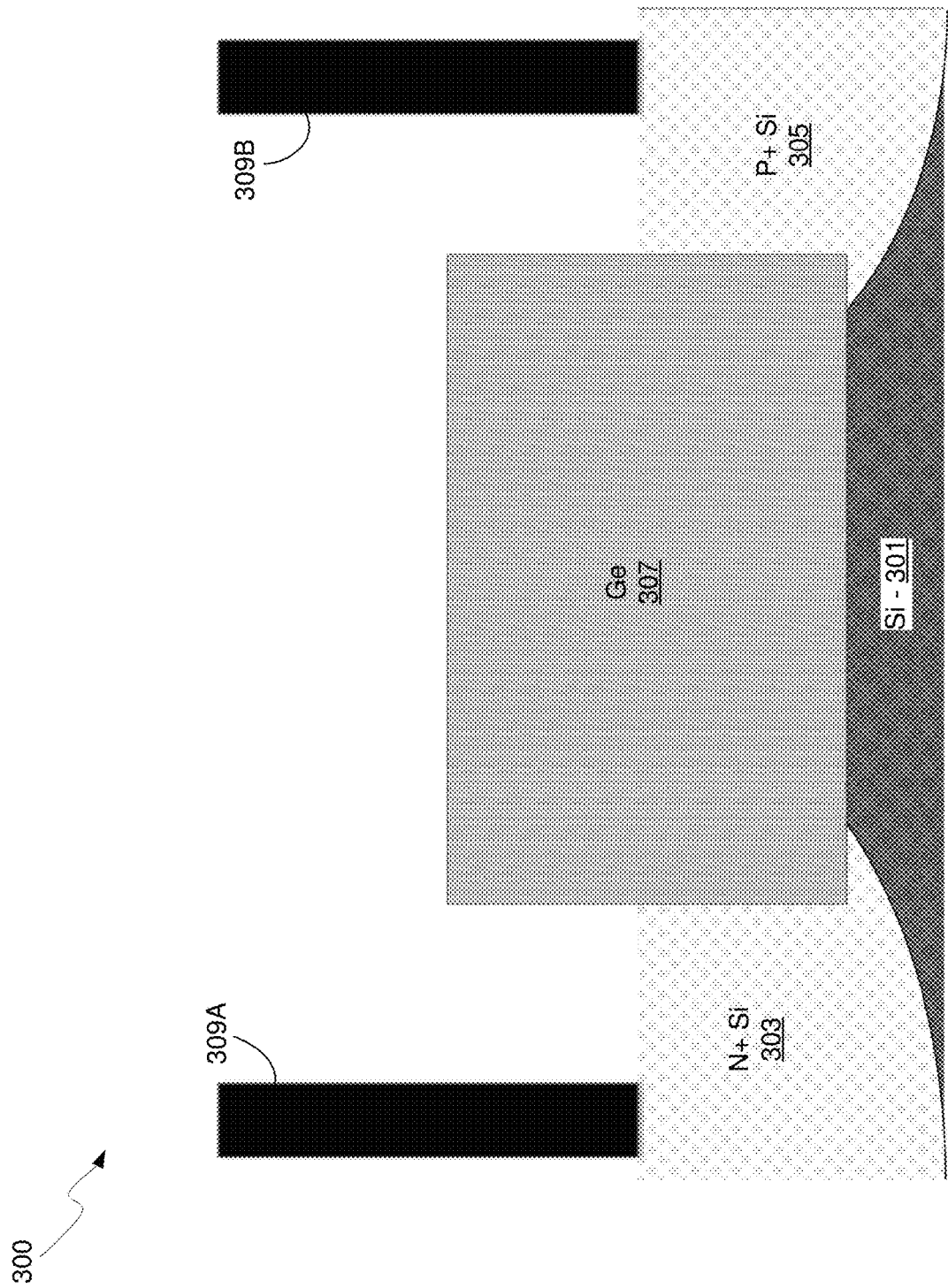
FIG. 3A illustrates a germanium photodetector without contacts on germanium, in accordance with an example embodiment of the disclosure.

FIG. 3A illustrates a germanium photodetector without contacts on germanium, in accordance with an example embodiment of the disclosure. Referring to FIG. 3A, there is shown a photodiode 300 comprising a silicon layer 301, an n+ silicon layer 303, a p+ silicon layer 305, a germanium layer 307, and contacts 309A and 309B. The n+ and p+ indicates that these layers are highly doped, on the order of $10^{19}$ $cm^{-3}$ for silicon.

In an example scenario, the n+ and p+ silicon layers 303 and 305 abutting/surrounding the germanium layer 307 assume an active electrical role by providing the means through which voltage and currents are applied and flow as well as the chemical potential difference causing the rise of the junction built-in voltage. This is accomplished by realizing a double heterostructure (DH) device in which the current flowing into the Ge device is injected/extracted through highly doped p- and n-type Si/Ge heterojunctions, where the doping is solely in the n+ silicon layer 303 and the p+ silicon layer 305.

The high doping, aided by defects at the Si/Ge interface, helps carrier tunneling through the heterojunctions thus realizing a low-drop, quasi-ohmic contact. The opposite doping of the two junctions creates the built-in potential of the p-i-n structure. The current flow out of the double heterostructure device and into an external circuit can now be accomplished by standard metal plugs placed on the highly doped (silicided) Si regions, far from the optical mode present in the germanium layer 307.

In order to create the tunneling junctions, a doping in the silicon on the order of $10^{19}$ cm$^{-3}$ or more is utilized. The germanium side of the heterojunction can be left undoped since the large density of defects induced by the presence of misfit dislocations at the Ge/Si metallurgical interface pins the Fermi level close to the valence band and provides enough charge to screen potential over a very small distance. A high density of states at the hetero-interface can also help tunneling by providing a conduction path for carrier hopping. The band-alignment is shown in FIG. 3B.

Figure 3B:
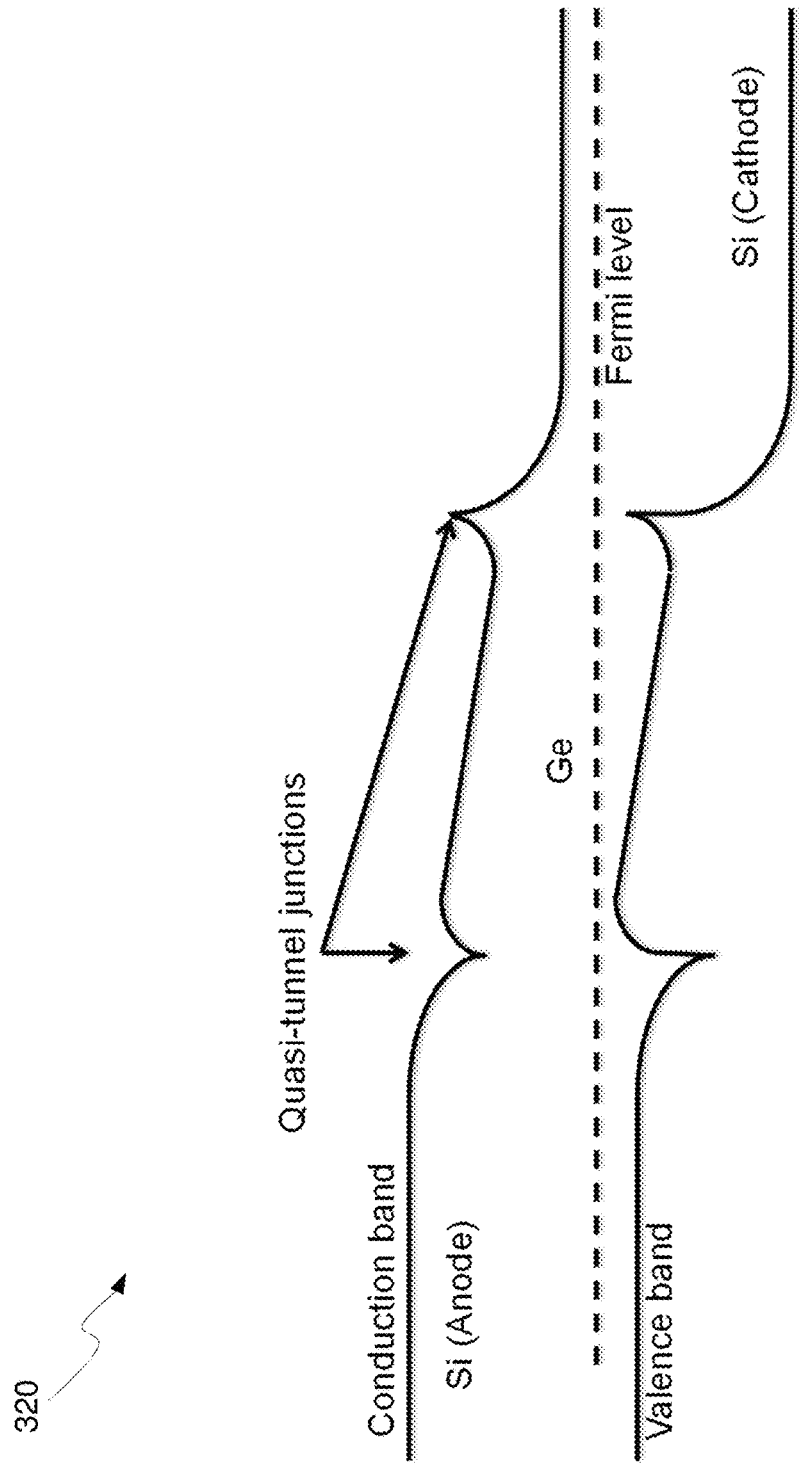
FIG. 3B illustrates the band diagram for the photodetector structure shown in FIG. 3A.

FIG. 3B illustrates the band diagram for the photodetector structure shown in FIG. 3A. Referring to FIG. 3B, there is shown a band diagram 320 for a double heterojunction silicon/germanium/silicon p-i-n structure. As shown, the Fermi level in the germanium layer is pinned to just above the valence band due to defects at the heterojunction interface, although this level may change with a change in the defect density. The heterointerfaces and associated defect density may provide a quasi-tunnel junction for carriers to and from the germanium layer.

Various double heterostructure designs may be utilized with silicon used for the contact structures. For example, vertical or horizontal double heterostructures may be utilized as shown in FIGS. 4 and 5.

Figure 4:
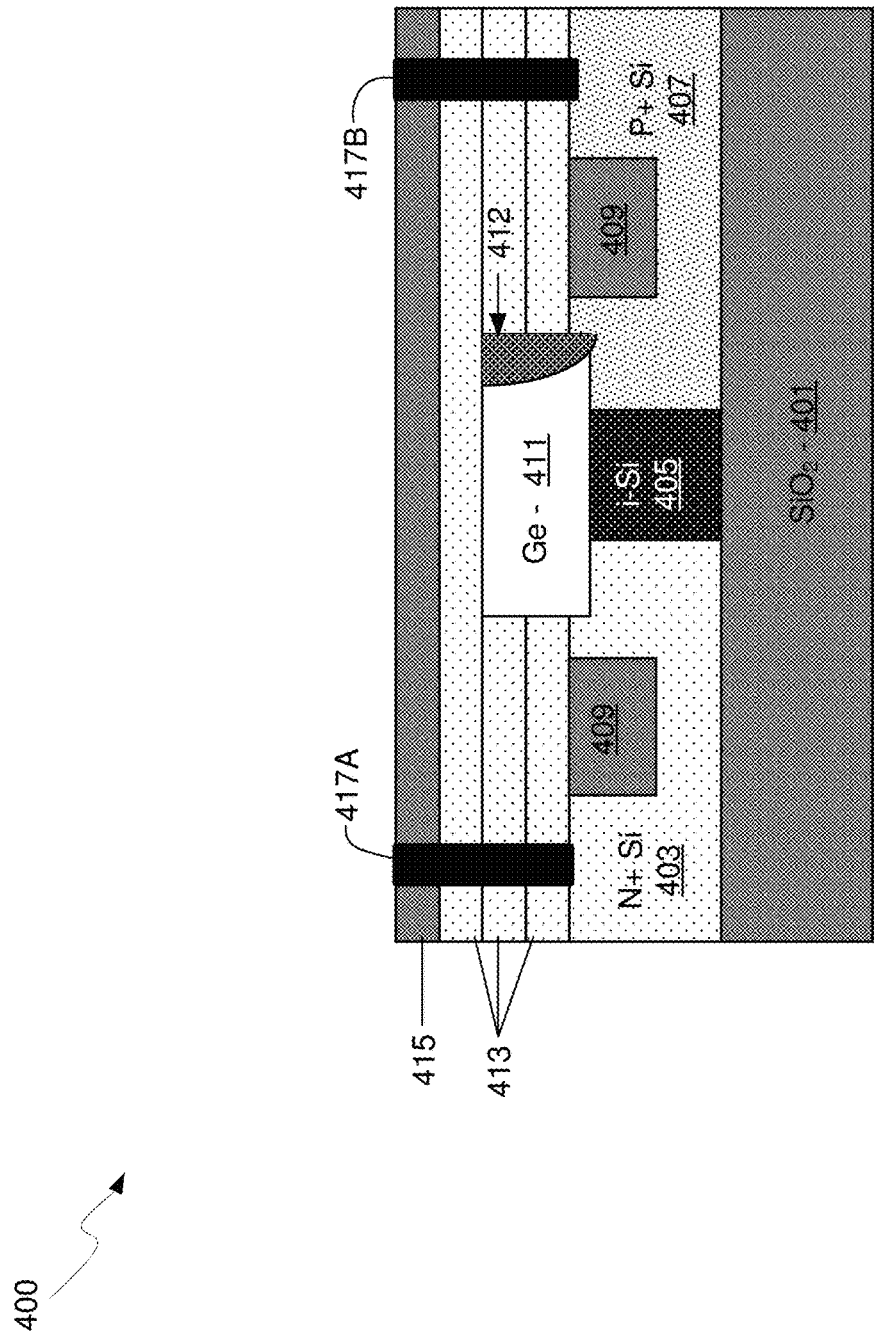
FIG. 4 illustrates a cross-section of a horizontal double heterostructure, in accordance with an example embodiment of the disclosure.
Figure 5:
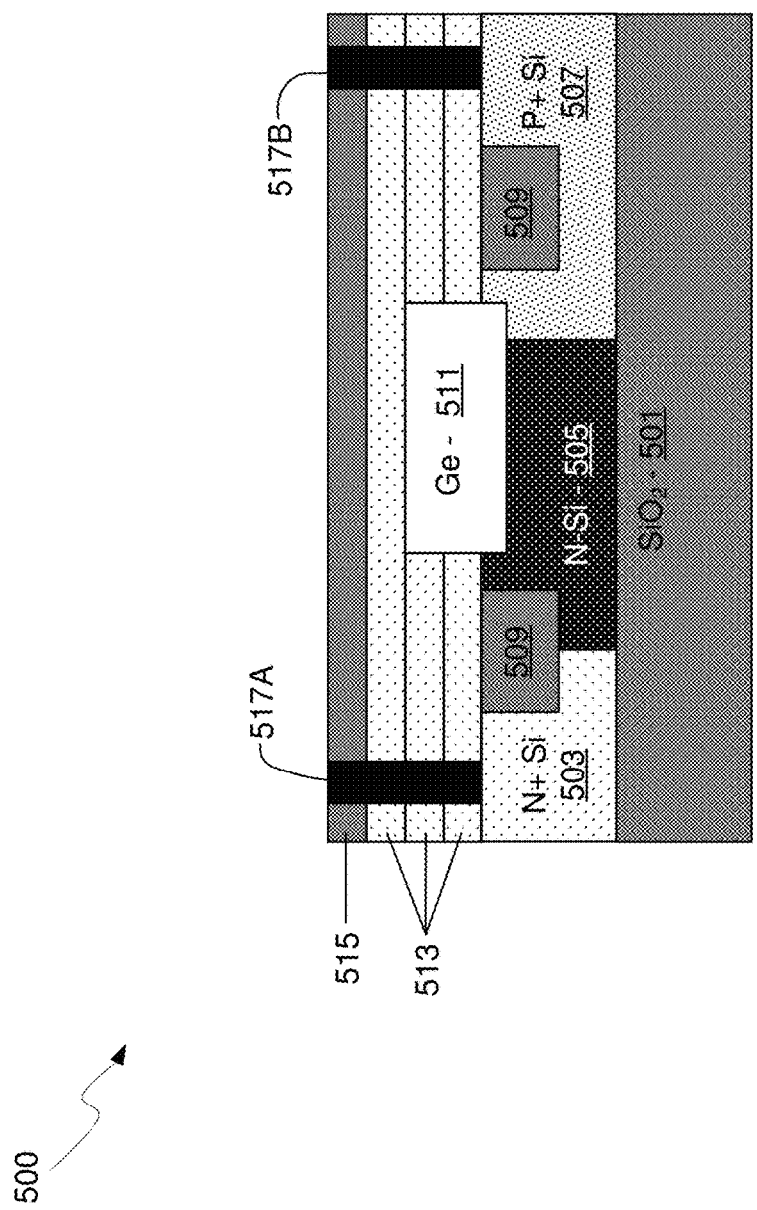
FIG. 5 illustrates a vertical double heterojunction germanium photodetector, in accordance with an example embodiment of the disclosure.

FIG. 4 illustrates a cross-section of a horizontal double heterostructure, in accordance with an example embodiment of the disclosure. Referring to FIG. 4, there is shown a photodetector 400 comprising a SiO$_2$ layer 401, n+ silicon layer 403, intrinsic silicon layer 405, p+ silicon layer 407, trenches 409, germanium layer 411, p+ germanium layer 412, waveguide layers 413, passivation layer 415, and metal contacts 417A and 417B.

The waveguide layers 413 may comprise a stack of semiconductor and dielectric layers for optical and electrical confinement of the photodetector 400 and may be utilized to guide optical waves into the photodetector 400. The passivation layer 415 may comprise a dielectric material, such as SiO$_2$ and may provide electrical isolation as well as protect underlying structures from oxidation, for example.

The contacting scheme of the photodetector 400 is based on a standard PIN homo-junction geometry with the field profile in the photo-sensitive Ge layer being horizontal, but with no contacts required in the germanium layer 411, which is the absorbing layer. As shown, the photodetector 400 may comprise a p-i-n structure formed by the p+ silicon layer 407, the (largely) undoped germanium layer 411, and the n+ silicon layer 403, but with an added p+ germanium layer 412.

To increase the bandwidth of the device, selective doping can be introduced in the germanium layer 411, e.g., the p+ germanium layer 412, to efficiently redistribute the field in order to facilitate faster photo-carrier collection. As an example, in the photodetector 400, p+ implants overlapping with the p+-Si layer 407 may be used in the germanium layer 411, which increases the field in the rest of the photo-sensitive region and improves the bandwidth without hampering responsivity.

It should be noted that the lack of contacts on the germanium enables such implant optimization since it decouples the location of the doping in the germanium from the contacts, thereby significantly reducing the restrictions on where implants can be placed. The optical trenches 409 on the side of the germanium layer 411 confine the optical mode and may be utilized in most waveguide detector designs.

FIG. 5 illustrates a vertical double heterojunction germanium photodetector, in accordance with an example embodiment of the disclosure. Referring to FIG. 5, there is shown a photodetector 500 comprising SiO$_2$ layer 501, n+ silicon layer 503, n-silicon layer 505, p+ silicon layer 507, trenches 509, germanium layer 511, waveguide layers 513, passivation layer 515, and metal contacts 517A and 517B.

In an example scenario, a vertical double heterostructure device, which utilizes a vertical hetero-structure geometry, but with the double heterojunction contacting technique is shown in FIG. 5. As shown, the primary junction utilized for the photo-collection process may be the n-Si/Ge vertical heterojunction. This configuration is advantageous due to the specific band alignment of the Ge/Si interface. And, as with the horizontal double heterostructure device in FIG. 4, the efficiency of the detector can also be improved by doping the top part of the germanium layer 511 p-type. But instead of the approach of contacting the p-Ge directly, the contact to the anode may be made via a narrow segment of the p+ silicon layer 507 overlapping with the germanium layer 511. Also, configuring a moderate level of doping in the n-silicon layer 505 directly underneath the absorbing germanium layer 511, may ensure that the n-Si/p+Si junction doesn't breakdown at low voltages, while still creating enough depletion in the germanium layer 511 to facilitate effective photo-carrier collection without excess dark current.

Figure 6:
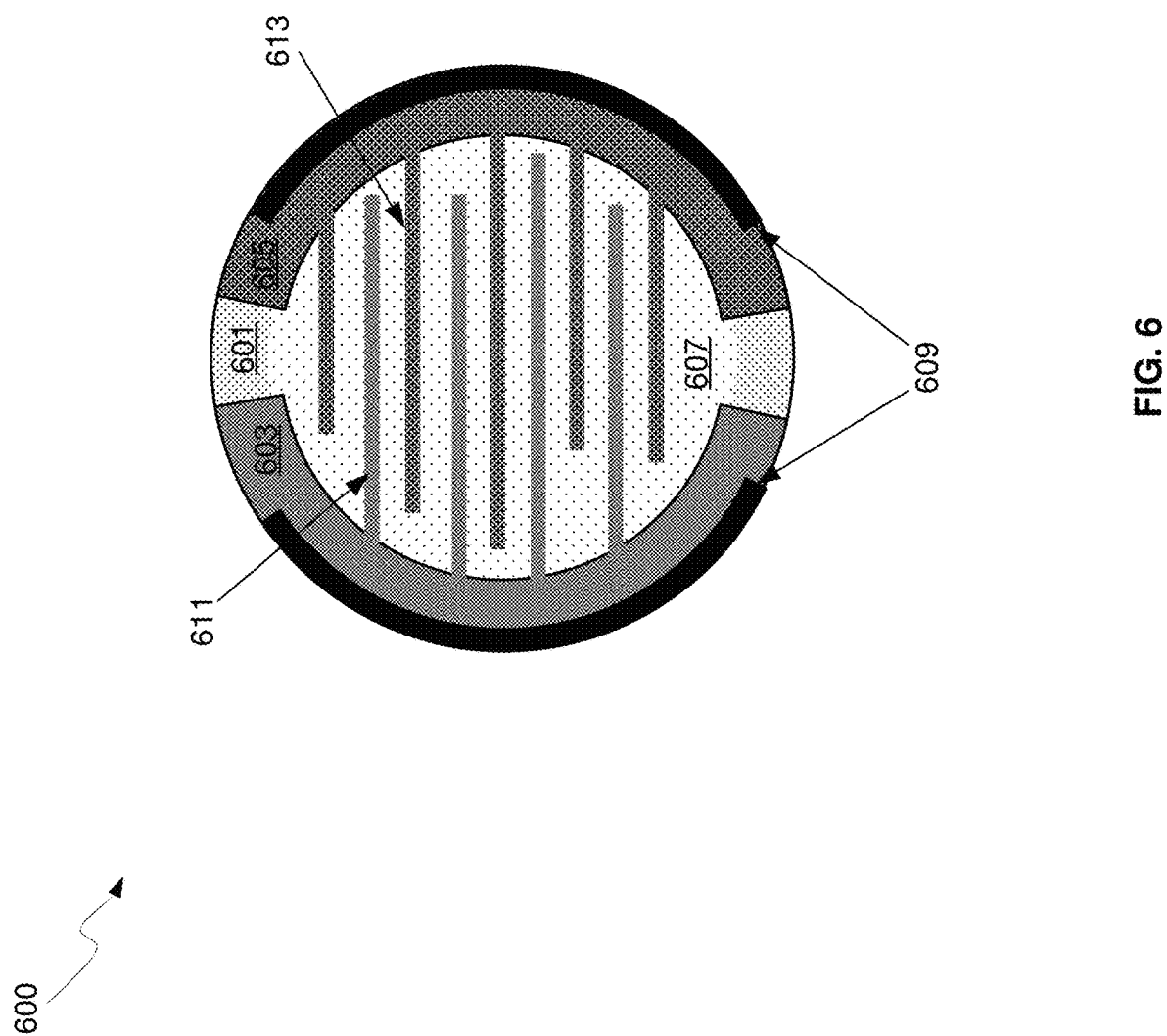
FIG. 6 illustrates a surface-illuminated horizontal double heterostructure germanium photodetector, in accordance with an example embodiment of the disclosure.

FIG. 6 illustrates a surface-illuminated horizontal double heterostructure germanium photodetector, in accordance with an example embodiment of the disclosure. Referring to FIG. 6, there is shown a photodetector 600 comprising an intrinsic silicon layer 601, n+ silicon layer 603, p+ silicon layer 605, germanium layer 607, contacts 609, n+ silicon fingers 611, and p+ silicon fingers 613.

In addition to the waveguide detectors shown previously, the double heterostructure architecture may also be applied to surface Illuminated photodetectors. FIG. 6 shows the implementation of a horizontal junction surface-illuminated photodiode. In place of metal fingers and contacts on the germanium layer 607, both the anode and cathode contacts may be established through fingers 611 and 613 of highly doped silicon that create contact-heterojunctions with the germanium layer 607.

The intrinsic silicon layer 601 may comprise silicon without intentional dopants and the n+ and p+ silicon layers 603 and 605 may be highly doped silicon layers and may extend over the central light sensing area of the photodetector 600 in the n+ silicon fingers 611 and p+ silicon fingers 613.

The contacts 609 may comprise metal layers on the n+ and p+ silicon layers 603 and 605 and may provide electrical interconnection between the photodetector 600 and other devices. The heterojunctions in the photodetector 600 are formed by the highly doped silicon fingers 611 and 613 on the germanium layer 607, which is the light absorbing layer, so the metal contacts are spatially separated from the light absorbing region, thereby reducing scattering.

Figure 7:
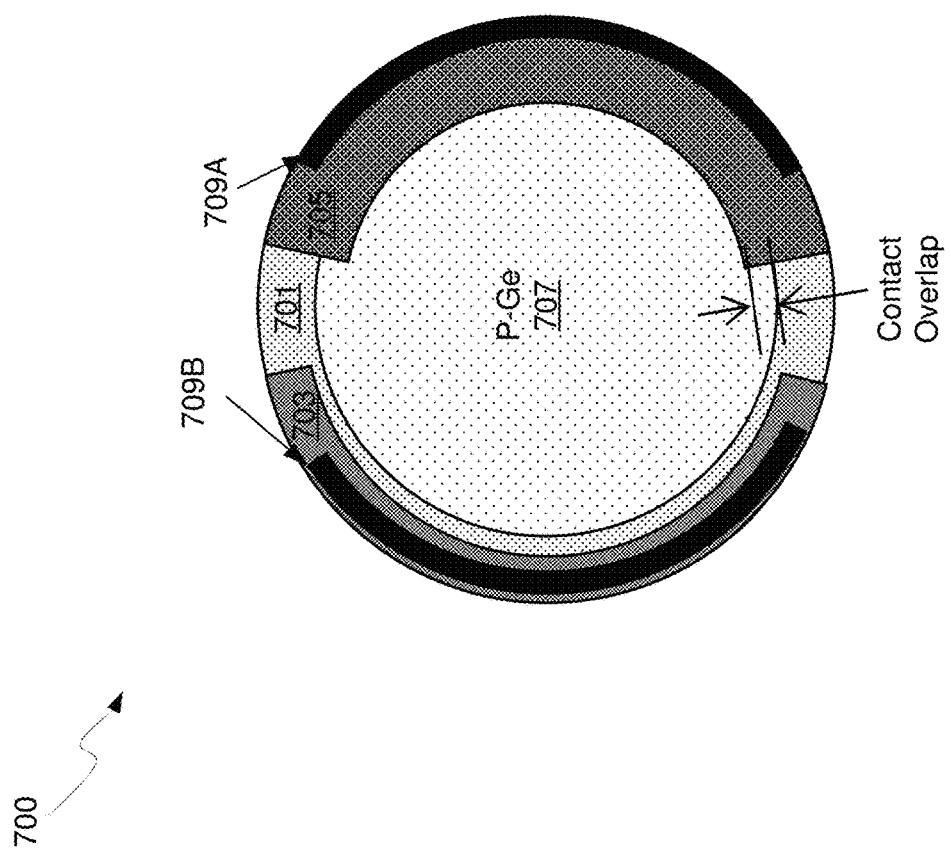
FIG. 7 illustrates a vertical junction surface-illuminated photodiode, in accordance with an example embodiment of the disclosure.

FIG. 7 illustrates a vertical junction surface-illuminated photodiode, in accordance with an example embodiment of the disclosure. Referring to FIG. 7, there is shown a photodetector 700 comprising n-silicon layer 701, n+ silicon layer 703, p+ silicon layer 705, p-germanium layer 707, and metal anode and cathode contacts 709A and 709B, respectively.

In the example shown, the anode contact, i.e., via the p-germanium layer 707, may be created through a narrow overlap between the p-germanium layer 707 and the p+ silicon 705, which creates the contacting heterostructure. As with the vertical double heterostructure waveguide detector, moderately doped n-type silicon 701 underneath the germanium 707 creates a vertical junction that accomplishes photo-carrier collection. The cathode contact 709B may be created directly on the n+ silicon 703. In both the above designs, metal contacts are successfully removed from the germanium, while providing sufficient electrical connectivity to the germanium layer 707 so as not to hamper the quantum efficiency of the device.

Figure 8:
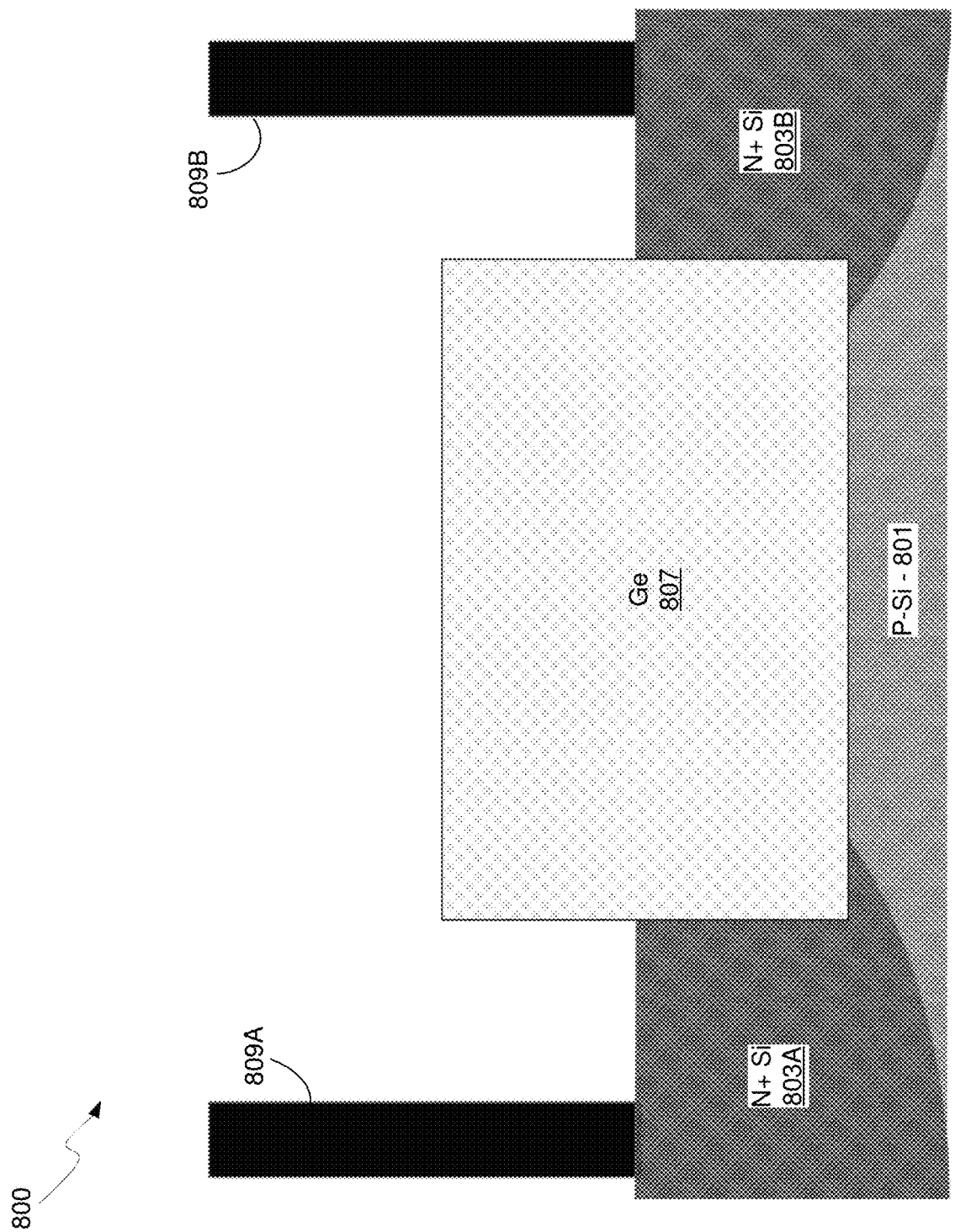
FIG. 8 illustrates a test structure for assessing n-type tunneling contacts, in accordance with an example embodiment of the disclosure.

FIG. 8 illustrates a test structure for assessing n-type tunneling contacts, in accordance with an example embodiment of the disclosure. Referring to FIG. 8, there is shown test structure 800 comprising a p-type silicon layer 801, n+ silicon layers 803A and 803B, undoped germanium layer 807, and metal contacts 809A and 809B.

In order to control and verify the quality of the n-type and p-type tunneling contacts independently, appropriate test structures may be formed in wafers. The test structure 800 shown in FIG. 8 comprises two n+ layers surrounding the undoped germanium allowing for an assessment of the n-type silicon/germanium heterojunction tunneling contacts. Current-voltage and capacitance measurements of structures with different doping levels may be utilized to determine proper doping levels for desired photodetector operation. The structures may be tested as single structures, or in chains for defect detection.

Figure 9:
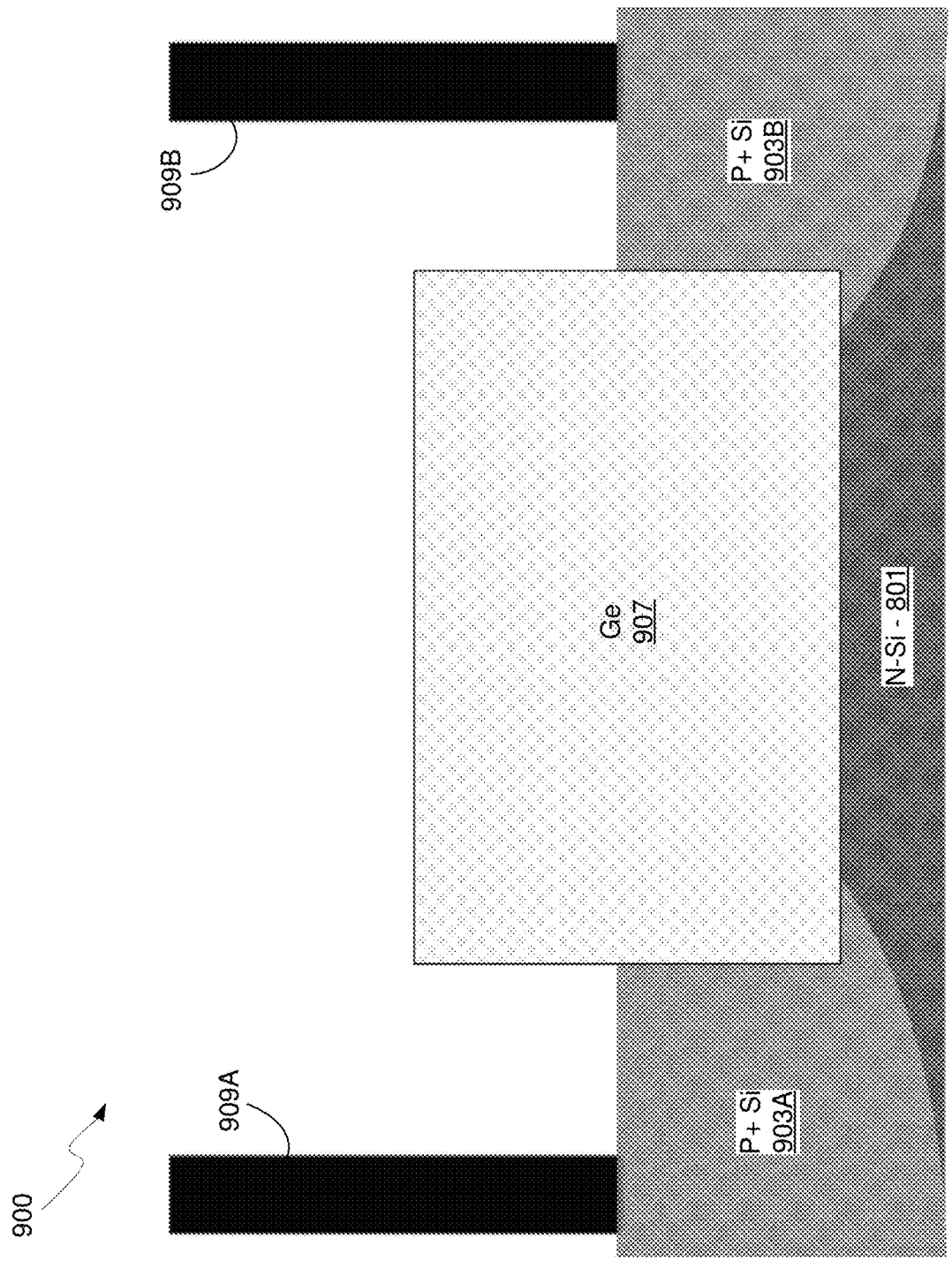
FIG. 9 illustrates a test structure for assessing p-type tunneling contacts, in accordance with an example embodiment of the disclosure.

FIG. 9 illustrates a test structure for assessing p-type tunneling contacts, in accordance with an example embodiment of the disclosure. Referring to FIG. 9, there is shown a test structure 900 comprising a n-type silicon layer 801, p+ silicon layers 903A and 903B, undoped germanium layer 907, and metal contacts 909A and 909B. As with the test structure 800, the test structure 900 comprises the same doping on each side of the germanium layer 907, but with p-type doping in this case.

Current-voltage and capacitance measurements of structures with different doping levels may be utilized to determine proper doping levels for desired photodetector operation. The structures may be tested as single structures, or in chains for defect detection.

Figure 10:
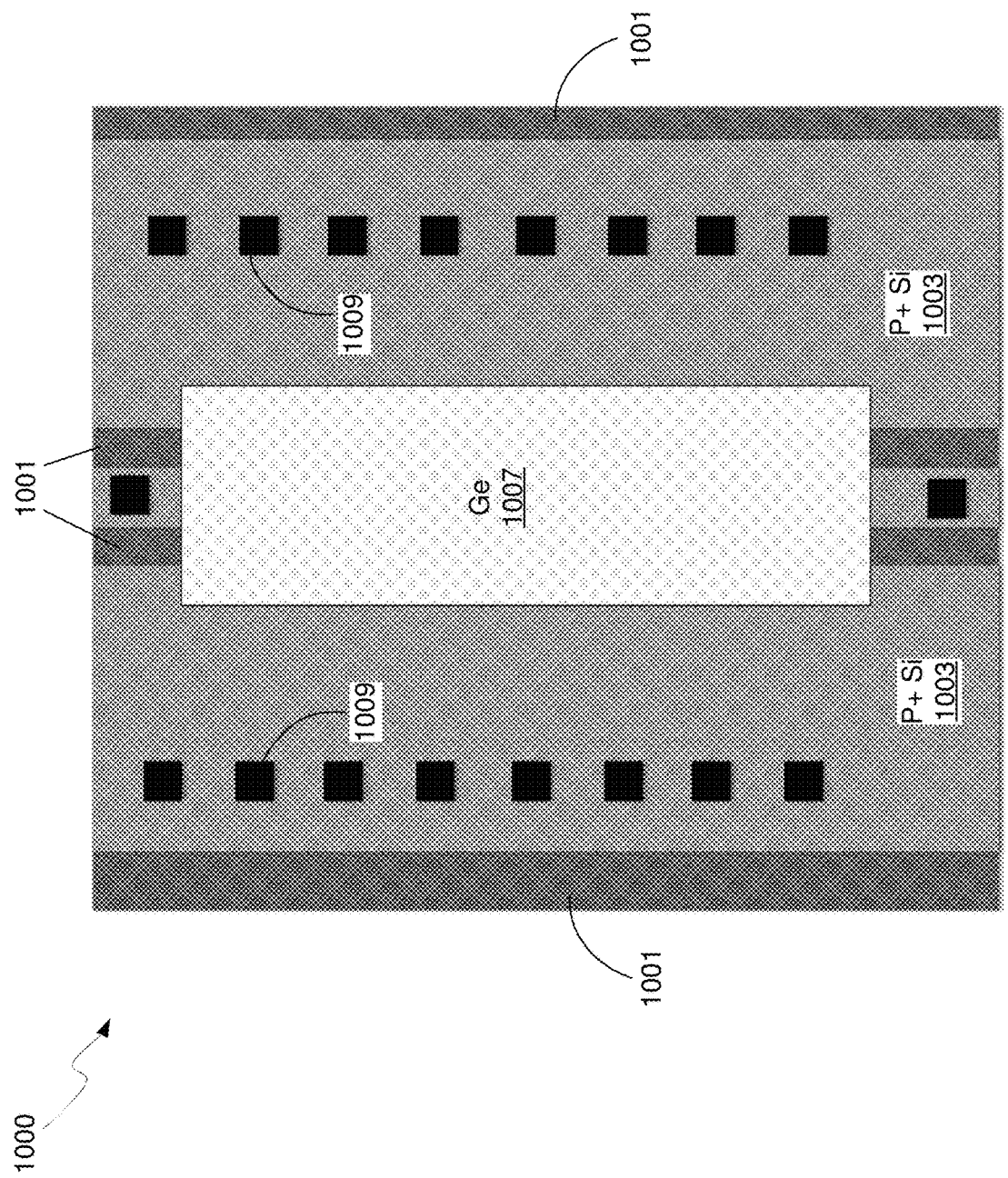
FIG. 10 illustrates 4-probe heterostructure test structures, in accordance with an example embodiment of the disclosure.

FIG. 10 illustrates 4-probe heterostructure test structures, in accordance with an example embodiment of the disclosure. Referring to FIG. 10, there is shown a Kelvin test structure 1000 comprising n-type silicon 1001, p+ silicon layer 1003, germanium layer 1007, and probe contacts 1009.

In an example In an example scenario, one or more of the probe contacts 1009 may act as force contacts and one or more other probe contacts may act as sense contacts in a Kelvin probe test. Kelvin (4-probe) structures may be used to measure the actual contact resistance clean of parasitics due to bulk semiconductor resistance and metal plugs resistance. The same structure with opposite doping can be used to test n-type heterojunctions.

In an example embodiment, a method and system are disclosed for germanium-on-silicon photodetectors without germanium layer contacts. In this regard, aspects of the disclosure may comprise a semiconductor die having a photodetector, where the photodetector comprises an n-type silicon layer, a germanium layer, a p-type silicon layer, and a metal contact on each of the n-type silicon layer and the p-type silicon layer, and where the photodetector is operable to: receive an optical signal, absorb the optical signal in the germanium layer, generate an electrical signal from the absorbed optical signal, and communicate the electrical signal out of the photodetector via the n-type silicon layer and the p-type silicon layer.

The photodetector may comprise a horizontal junction double heterostructure where the germanium layer is above the n-type silicon layer and the p-type silicon layer. An intrinsically-doped silicon layer may be below the germanium layer between the n-type silicon layer and the p-type silicon layer. A portion of the germanium layer nearest the p-doped silicon layer may be p-doped. The photodetector may comprise a vertical junction double heterostructure where the germanium layer is above a lower-doped n-type silicon layer.

The n-type silicon layer and the p-type silicon layers may be on opposite sides of the lower-doped silicon layer below the germanium layer where the p-type silicon layer and the lower-doped n-type silicon layer are in contact with the germanium layer while the n-type silicon layer is not. A top portion of the germanium layer may be doped p-type. The photodetector may comprise a surface-illuminated double heterostructure photodetector. The n-type silicon layer and the p-type silicon layer in the surface-illuminated double heterostructure photodetector may comprise interdigitated fingers.

In another example scenario, a method and system are disclosed for germanium-on-silicon photodetectors without germanium layer contacts. In this regard, aspects of the disclosure may comprise a semiconductor die having a double heterostructure photodetector, where the double heterostructure photodetector comprises an n-type silicon layer, a germanium layer with p-type doping in a portion of the germanium layer, a p-type silicon layer, and a metal contact on each of the n-type silicon layer and the p-type silicon layer, and where the double heterostructure photodetector is operable to: receive an optical signal, absorb the optical signal in the germanium layer, generate an electrical signal from the absorbed optical signal, and communicate the electrical signal out of the photodetector via the n-type silicon layer and the p-type silicon layer.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration.

As utilized herein, the terms "e.g.," and "for example" set off lists of one or more non-limiting examples, instances, or illustrations. As utilized herein, circuitry or a device is "operable" to perform a function whenever the circuitry or device comprises the necessary hardware and code (if any is necessary) to perform the function, regardless of whether performance of the function is disabled or not enabled (e.g., by a user-configurable setting, factory trim, etc.).

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A surface-illuminated photodetector comprising:
   a first silicon layer;
   a germanium layer disposed on the first silicon layer;
   an n-type silicon layer and a p-type silicon layer that are arranged at a periphery of the germanium layer, wherein one or both of the n-type silicon layer and the p-type silicon layer partially overlap a top surface of the germanium layer; and
   metal contacts that contact portions of the n-type silicon layer and the p-type silicon layer that are not overlapping with the top surface.

2. The photodetector of claim 1, wherein the photodetector is configured as a double heterostructure photodetector.

3. The photodetector of claim 1, wherein the germanium layer is partially recessed into the first silicon layer.

4. The photodetector of claim 1,
   wherein each the n-type silicon layer and the p-type silicon layer comprise respective fingers, and
   wherein the respective fingers are interdigitated above the top surface of the germanium layer.

5. The photodetector of claim 1, wherein the n-type silicon layer and the p-type silicon layer are formed as respective segments of a ring shape.

6. The photodetector of claim 5,
   wherein the segment of the p-type silicon layer has a greater width than the segment of the n-type silicon layer, and
   wherein the segment of the p-type silicon layer overlaps the top surface of the germanium layer.

7. The photodetector of claim 6, wherein the germanium layer comprises a p-type germanium layer.

8. The photodetector of claim 1, wherein the first silicon layer comprises intrinsic silicon.

9. The photodetector of claim 1, wherein the first silicon layer comprises n-type silicon having a doping level less than the n-type silicon layer.

10. The photodetector of claim 1, wherein the metal contacts contact the periphery of the n-type silicon layer and the p-type silicon layer.

11. A method comprising:
    receiving an optical signal at a top surface of a germanium layer of a photodetector, wherein an n-type silicon layer and a p-type silicon layer of the photodetector are arranged at a periphery of the germanium layer, wherein one or both of the n-type silicon layer and the p-type silicon layer partially overlap the top surface, wherein metal contacts of the photodetector contact portion of the n-type silicon layer and the p-type silicon layer that are not overlapping with the top surface; and
    generating an electrical signal from the optical signal.

12. The method of claim 11, wherein the photodetector is configured as a double heterostructure photodetector.

13. The method of claim 11,
    wherein the germanium layer is disposed on a first silicon layer, and
    wherein the germanium layer is partially recessed into the first silicon layer.

14. The method of claim 13, wherein the first silicon layer comprises intrinsic silicon.

15. The method of claim 13, wherein the first silicon layer comprises n-type silicon having a doping level less than the n-type silicon layer.

16. The method of claim 11,
    wherein each the n-type silicon layer and the p-type silicon layer comprise respective fingers, and
    wherein the respective fingers are interdigitated above the top surface of the germanium layer.

17. The method of claim 11, wherein the n-type silicon layer and the p-type silicon layer are formed as respective segments of a ring shape.

18. The method of claim 17,
    wherein the segment of the p-type silicon layer has a greater width than the segment of the n-type silicon layer, and
    wherein the segment of the p-type silicon layer overlaps the top surface of the germanium layer.

19. The method of claim 18, wherein the germanium layer comprises a p-type germanium layer.

20. The method of claim 11, wherein the metal contacts contact the periphery of the n-type silicon layer and the p-type silicon layer.

* * * * *